Dec. 24, 1968 J. C. MARINACE 3,418,226

METHOD OF ELECTROLYTICALLY ETCHING A SEMICONDUCTOR HAVING A SINGLE IMPURITY GRADIENT

Filed May 18, 1965

INVENTOR.
JOHN C. MARINACE

BY

Francis J. Thomas

ATTORNEY

United States Patent Office 3,418,226

Patented Dec. 24, 1968

3,418,226

METHOD OF ELECTROLYTICALLY ETCHING A SEMICONDUCTOR HAVING A SINGLE IMPURITY GRADIENT

John C. Marinace, Yorktown Heights, N.Y., assignor to International Business Machines Corporation, Armonk, N.Y., a corporation of New York Filed May 18, 1965, Ser. No. 456,684
10 Claims. (Cl. 204—143)

ABSTRACT OF THE DISCLOSURE

An electrolytic etching process is described wherein the system parameters correspond to a predetermined impurity concentration in a semiconductor body of single-conductivity having an impurity gradient. Accordingly, the electrolytic etching process is self-limiting along the contour of the predetermined impurity concentration in the semiconductor body.

This invention relates to techniques for preferentially etching semiconductor materials and, in particular, to techniques for etching regions having impurity gradients (non-uniform impurity concentrations) to depths that correspond to various contours or levels of impurity concentrations.

Many semiconductor materials have at least one region wherein an impurity gradient exists. For example, gallium arsenide that has had zinc diffused from the surfaces has an impurity concentration which changes abruptly defining a $p^+$ region (where the acceptor doping concentration is above the level of degeneracy) and a conventional p region.

Various techniques are well known for etching to the depth of a junction between regions of different conductivity types (e.g., p-n junction). In many applications, it is desirable to etch a semiconductor to a contour (of constant impurity concentration) other than a junction between regions of different conductivity types. For example, the laser device shown in U.S. patent application, Ser. No. 367,106 by Gordon Lasher, filed on May 13, 1964, employs a semiconductor material where a portion of the $p^+$ region is partially removed without affecting the p region. In order to derive this structure, it is necessary to remove material in a depth which is a function of the impurity concentration. A further use of such a structure is an electro-luminescent diode with the major part of the highly-absorbent $p^+$ region removed to provide greater output light intensity.

Obviously, any process which removes both the $p^+$ and the p regions must necessarily remove the $p^+$ region at some point in the process. However, the inventive process stops automatically at a contour of predetermined impurity concentration (e.g., the $p^+$-p boundary) without intervention. That is, this etching process is essentially time-invariant, as additional subjection to the process does not materially affect the depth of etch. This time invariance is of tremendous importance because the extreme narrowness of the regions in many applications render the time-responsive processes difficult to control the close tolerances that are required.

Preferential etching to a predetermined contour of impurity concentration is accomplished in accordance with the present invention techniques by controlling the parameters in an electrolytic etching process. That is, the material is etched to an impurity concentration that is determined by the electrical properties of the electrolytic process. In the preferred embodiment of the invention, the process consists of: metal-plating the opposite ($p^+$ and n) surfaces of a $p^+$-p-n semiconductor material (only if lowresistance ohmic contacts are required), coating the metallic surfaces with an etch resist mask, etching the surfaces to remove the metal plating from the regions which are not etched, electrolytically etching the semiconductor material to the desired impurity concentration and removing the resist mask.

Thus, it is an object of the present invention to provide preferential etching techniques for use with semiconductor materials.

Another object is to provide preferential etching techniques for use with semiconductor materials having at least one region with a non-uniform impurity distribution, wherein this region is electrolytically etched to a contour of predetermined impurity concentration.

Another object is to provide preferential etching techniques for use with semiconductor material wherein $p^+$-type material is etched without substantially affecting p-type material or n-type material.

A further object is to provide preferential etching techniques for use with galluim arsenide (GaAs) semiconductor material which is doped to form a $p^+$-type region, a p-type region, and an n-type region, wherein the $p^+$-type region is electrolytically etched in accordance with a masking pattern, without substantially affecting the p-type material or the n-type material.

The foregoing and other objects, features and advantages of the invention will be apparent from the following more particular description of preferred embodiments of the invention, as illustrated in the accompanying drawings:

Figure 1A:
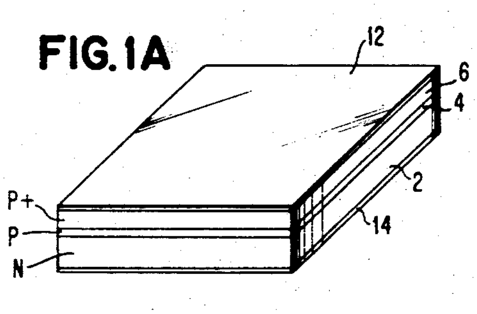
FIGS. 1A–1D are diagrams illustrating various steps of the inventive process.
Figure 2:
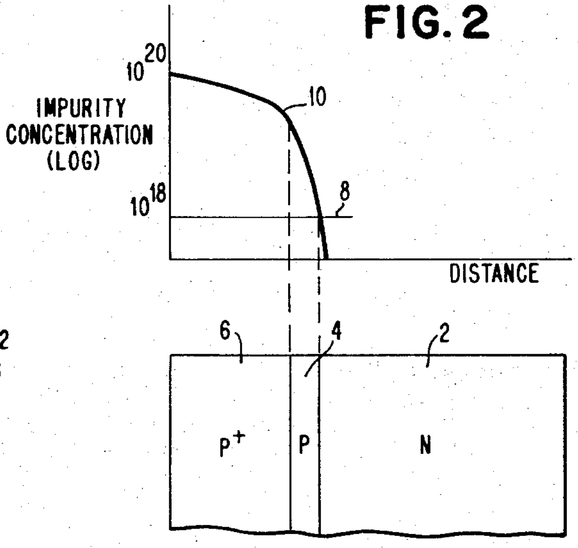
FIG. 2 is a diagram showing the contour of impurity concentration through a cross-section of gallium arsenide into which zinc has been diffused.

The semiconductor material contains an n region 2, a p region 4, and a $p^+$ region 6, as shown in FIGS. 1A–1D. The impurity concentration throughout the materials are shown in FIG. 2. A horizontal line 8 represents uniform doping (about $10^{18}$ atoms per cc.) with a donor, such as selenium (Se) or tellurium (Te). A curved line 10 represents nonuniform doping with an acceptor, such as zinc (Zn). As shown in FIG. 2, the acceptor impurity concentration is high (about $10^{20}$ atoms per cc.) and essentially uniform throughout the $p^+$ region. The concentration drops off sharply through the p region, and the p-n junction is attained where the acceptor and donor impurity concentrations are equal.

Figure 1B:
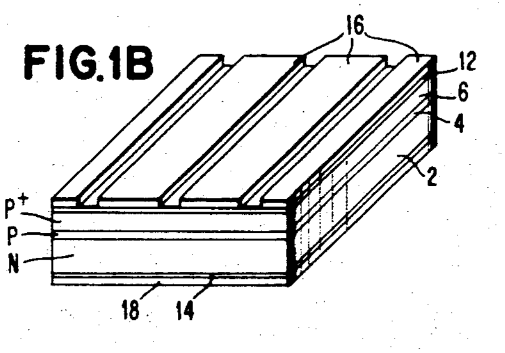

Returning to FIG. 1A, the semiconductor material is plated with metal 12, 14, such as successive layers of gold (Au), tin (Sn) and indium (In). The metal plated structure is then covered with an etch resist 16, 18, such as amorphous selenium or wax as shown in FIG. 1B. The etch resist is applied as a mask to protect those regions which are not to be etched. The mask is shown as several parallel strips through FIGS. 1A–1D as the resultant material is to be ultimately cut into many sections, each of which can be used as a laser medium. Although not shown for simplicity, the etch resist also covers the edges of the disc.

Figure 1C:
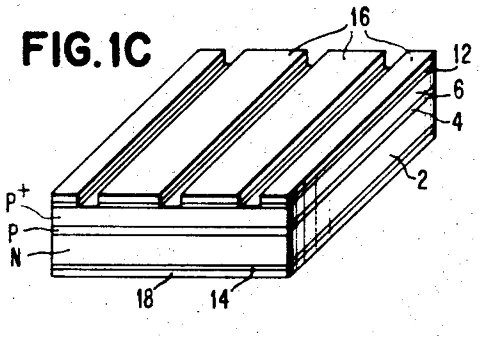
Figure 1D:
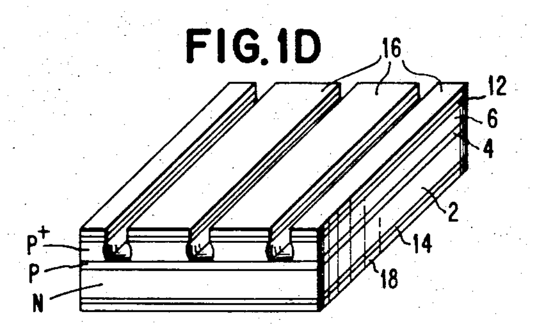

The metal that is not masked is then etched with an acid, such as hydrochloric acid (HF) to produce the structure shown in FIG. 1C. The $p^+$ region is then removed in the unmasked areas by electrolytic etching with a basic or caustic etch 20, (FIG. 3) such as potassium hydroxide (KOH) or sodium hydroxide (NaOH). The solution is not critical, but stronger solutions reduce the etching time.

Figure 3:
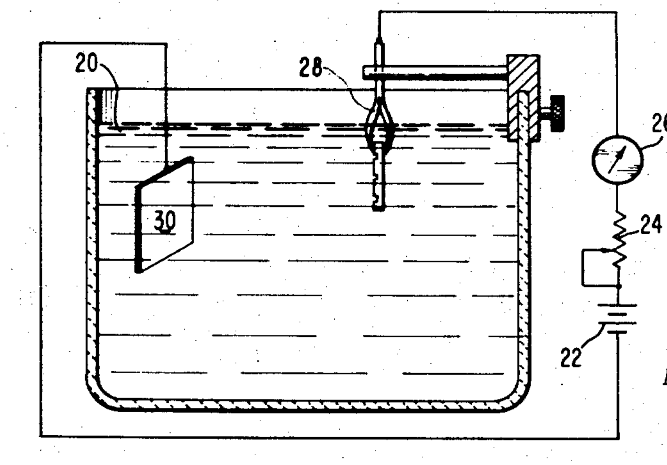
FIG. 3 is a diagram showing the apparatus that is employed in the electrolytic etching process in the preferred embodiment of the invention.

The depth of the etch is dependent upon the electrical properties of the electrolytic process which are readily determinable for the particular materials and impurities that are used. In FIG. 3, a battery 22 supplies current through a potentiometer 24 and an ammeter 26 to conducting clamp 28 which contacts the metal 12, 14 that is plated on the semiconductor material. The other battery terminal is connected to a conducting plate 30 that is located in the electrolyte. The etch resist is either removed or pierced in the regions where the clamp is affixed. Although metal strips have been etched away during the previous step, there is still conduction in the remaining metal in the vicinity of the edges of the structure. Alternatively, the etch resist can be applied with a pattern which provides intentional paths for current flow between the metal strips. The electrolytic process can also be effected with electrical connections to only metal 12 or metal 14.

The electrolytic etch can remove semiconductor material to any impurity depth that is desired by application of the appropriate current as determined by the setting of potentiometer 24. For any given process parameters, the material is etched to a certain contour of impurity concentration. The process is self-terminating, as additional exposure to the electrolytic etching does not increase the depth of etch. Thus, the depth of the etch increases as the current is increased (by reducing the resistance of the potentiometer 24) until the desired depth is obtained. When the correct current is established (as indicated by ammeter 26) for the materials and parameters that are employed, the process can be repeated to mass produce the desired semiconductor structures without further alteration of the setting of potentiometer 24.

Obviously, both metal and semiconductor material can be removed with the above-described electrolytic etch, but longer time is required because the particular metal plating mentioned earlier is etched at a slower rate than by using hydrochloric acid.

FIG. 10 shows the resulting structure when the $p^+$ region is removed. The etch resist 16, 18 is removed as the final step in the process (by dissolution or evaporation according to well-known techniques). This structure is readily obtainable because, as shown in FIG. 2, the impurity concentration changes radically at the boundary of the $p^+$ region, permitting the process to be practiced with broad tolerances of the etching parameters. However, the inventive technique can be practiced to provide etching to other contours of impurity concentration, such as within the $p^+$ or p region.

As described above, the process automatically stops when the appropriate etching depth is reached. Further subjection to the etching process merely increases the $p^+$ undercutting beneath the metal plating.

While the process can be practiced with a variety of materials and parameters, the process has been found to give excellent results with the following specific materials and parameters:

Semiconductor material 2, 4, 6.—Gallium arsenide with a thickness of about .015", n-type, of about $2\times10^{18}$, diffused zinc at about 850° C. for about two hours, giving a junction depth of about .001", the $p^+$-p boundary being about .0001" less in depth, where a wafer of about .004" thickness is lapped as the specimen to be used in the process.

Metal plating 12, 14.—Electrolessly-plated in several cm.$^3$ of a solution of about one gram of gold chloride $HAuCl_r\cdot3H_2O$ in 700 ml. of water and 100 ml. of hydrofluoric acid (HF) to provide about a 5,000 A. plating of gold; then, electroplated with about 5,000 A. of tin (Sn) from a tin fluoroborate bath $Sn(BF_4)_4$; then fired at about 450° C. for about 10 seconds; then electroplated with about .0005" of indium (In) from a fluoroborate $In(BF_4)_3$.

Etch reset 16, 18.—Sprayed on solution of high vacuum wax to a thickness of about .0005", masked to provide uncovered slits with a width of about .002".

Metal etch.—Hydrochloric acid, 37% solution for about 30 seconds.

Electrolyte 20.—Potassium hydroxide (KOH) at a solution of 0.5 N–5 N.

Current through meter 26.—About 2.5 ma. per inch of slit length for 1 N KOH electrolyte solution.

Etch resist removal.—Dissolved by trichloroethylene or toluene.

Electrolytic etching time.—About 8 minutes (not critical as additional time does not increase depth of etch).

Thus, according to the inventive process, a semiconductor material with an impurity gradient can be etched to a depth which depends upon the impurity concentration through the material. This process is stable and consistently provides resulting semiconductor structures with predetermined characteristics. The process is not limited to etching depths extending to junctions between dissimilar type of materials but the materials can be etched to any desired contour of impurity concentration, as long as the material contains a non-uniform impurity concentration. Furthermore, the entire material can be of a single conductivity type (p or n).

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A preferential etching technique for a semiconductor material comprising the steps of:

producing a semiconductor material having an impurity gradient in a region of single-conductivity type, providing an electrolytic etching environment including an electrolytic etching solution and a current path defined in part by said electrolytic etching solution;

positioning said material in said electrolytic etching environment so as to be immersed in said electrolytic etching solution and included in said current path, and controlling the magnitude of current directed continuously along said current path with respect to the normality of said electrolytic etching solution to provide electrical properties in said electrolytic etching environment which are relatively time-invariant and correspond to a predetermined impurity concentration within said impurity gradient, the normality of said electrolytic etching solution being maintained substantially constant, whereby said material is etched to the depth of said impurity concentration relatively independently of the time during which the material is positioned in said electrolytic etching environment.

2. The method described in claim 1, wherein the region having the impurity gradient has an impurity concentration-to-depth relationship that is non-linear.

3. The method described in claim 2, wherein the region is of p-conductivity type.

4. The method described in claim 3, wherein said region includes a $p^+$ portion having an impurity concentration greater than said predetermined impurity concentration whereby part of the $p^+$ portion of the region is removed without substantially affecting the p portion of the region.

5. A preferential etching technique for a semiconductive material comprising the steps of:

producing a semiconductor material having impurity gradient in a region of single-conductivity type, applying an electrolytic etch resist to predetermined surface portions of said material;

providing an electrolytic etching environment including an electrolytic etching solution and a current path defined in part by said electrolytic etching solution;

positioning said material in said electrolytic etching environment so as to be immersed in said electrolytic etching solution and included in said current path, and controlling the magnitude of current directed continuously along said current path with respect to the normality of said electrolytic etching solution to provide electrical properties in said electrolytic etching environment which are relatively time-invariant and correspond to a predetermined impurity gradient, the normality of said electrolytic etching solution being maintained substantially constant;

whereby said material is etched to the depth of said impurity concentration relatively independent of the time during which the material is positioned in said electrolytic etching environment.

6. The method described in claim 5, wherein the region having the impurity gradient has an impurity concentration-to-depth relationship that is non-linear.

7. The method described in claim 6, wherein the region is of p-conductivity type.

8. The method described in claim 7, wherein said region include a $p^+$ portion having an impurity concentration greater than said predetermined impurity concentration whereby part of the $p^+$ portion of the region is removed without substantially affecting the p portion of the region.

9. The method described in claim 5, wherein the etch resist comprises gold.

10. A preferential etching technique comprising the steps of:

producing gallium arsenide semiconductor material with a zinc-doped region having a $p^+$-p impurity gradient;

providing an electrolytic etching environment including an electrolytic etching solution and a current path defined in part by said electrolytic etching solution;

positioning said material in said electrolytic etching environment so as to be immersed in said electrolytic etching solution and included in said current path, and controlling the magnitude of current directed continuously along said current path with respect to the normality of said electrolyte etching solution to provide electrical properties in said electrolytic etching environment corresponding to the impurity concentration at the $p^+$-p boundary, the normality of said electrolytic etching solution being maintained substantially constant;

whereby the material is etched to the $p^+$-p boundary relatively independently of the time during which the material is located in said electrolytic etching environment.

References Cited

UNITED STATES PATENTS

| | | | |
|---|---|---|---|
| 3,023,153 | 2/1962 | Kurshan | 204—143 |
| 3,046,176 | 7/1962 | Bosenberg | 204—143 |
| 3,081,418 | 3/1963 | Manintveld | 204—143 |
| 3,117,067 | 1/1964 | Jacobs | 204—143 |

ROBERT K. MIHALEK, *Primary Examiner.*